US012402390B2

(12) United States Patent
Chen et al.

(10) Patent No.: US 12,402,390 B2
(45) Date of Patent: Aug. 26, 2025

(54) METHOD OF MANUFACTURING SILICON CARBIDE SEMICONDUCTOR POWER DEVICE

(71) Applicant: LEAP Semiconductor Corp., Taoyuan (TW)

(72) Inventors: Wei-Fan Chen, Taichung (TW); Kuo-Chi Tsai, Taoyuan (TW)

(73) Assignee: LEAP Semiconductor Corp., Taoyuan (TW)

( * ) Notice: Subject to any disclaimer, the term of this patent is extended or adjusted under 35 U.S.C. 154(b) by 619 days.

(21) Appl. No.: 17/864,337

(22) Filed: Jul. 13, 2022

(65) Prior Publication Data

US 2024/0021478 A1 Jan. 18, 2024

(51) Int. Cl.
*H10D 84/03* (2025.01)
*H10D 12/01* (2025.01)
*H10D 30/65* (2025.01)
*H10D 62/832* (2025.01)

(52) U.S. Cl.
CPC ......... *H10D 84/035* (2025.01); *H10D 12/031* (2025.01); *H10D 30/658* (2025.01); *H10D 62/8325* (2025.01)

(58) Field of Classification Search
CPC ............... H10D 84/035; H10D 12/031; H10D 62/8325; H10D 62/10; H10D 62/107; H10D 62/157; H10D 62/393; H10D 64/513; H10D 84/01; H10D 84/856; H10D 30/658; H10D 30/0289
See application file for complete search history.

(56) References Cited

U.S. PATENT DOCUMENTS

| 5,589,405 | A | 12/1996 | Contiero et al. |
| 6,979,863 | B2 | 12/2005 | Ryu |
| 7,445,983 | B2 | 11/2008 | Fujishima et al. |
| 8,574,973 | B1 | 11/2013 | You et al. |

(Continued)

FOREIGN PATENT DOCUMENTS

| EP | 0514060 | 2/1998 |
| JP | 2009302091 | 12/2009 |
| JP | 5707770 | 4/2015 |

OTHER PUBLICATIONS

"Office Action of Taiwan Counterpart Application", issued on May 4, 2023, p. 1-p. 4.

(Continued)

*Primary Examiner* — Brent A. Fairbanks
*Assistant Examiner* — Daniel J Hibbert
(74) *Attorney, Agent, or Firm* — JCIPRNET

(57) ABSTRACT

A method of manufacturing a silicon carbide semiconductor power device is provided. In the method, the power device in high voltage (HV) region and CMOS device in the low voltage (LV) region are formed together, so the cost and time can be saved efficiently. First, a first drift layer is formed on a substrate, and then a shielding region is formed in the first drift layer. The shielding region includes a continuous region in the LV region. Then, a second drift layer is formed on the first drift layer. A pick-up region is formed in the second drift layer, wherein the pick-up region connects to the continuous region of the shielding region, and then NMOS and PMOS in the LV region and the power device in HV region are formed simultaneously. NMOS and PMOS are surrounded by the pick-up region and the continuous region, thereby minimizing body effect.

19 Claims, 12 Drawing Sheets

(56) References Cited

U.S. PATENT DOCUMENTS

| | | |
|---|---|---|
| 8,946,726 B2 | 2/2015 | Harris et al. |
| 10,217,832 B2 | 2/2019 | Zhang |
| 10,217,859 B2 | 2/2019 | Zhang |
| 2005/0145915 A1 | 7/2005 | Fatemizadeh et al. |
| 2014/0225190 A1 | 8/2014 | Mallikarjunaswamy |
| 2014/0264564 A1 | 9/2014 | Cheng et al. |
| 2018/0182885 A1 | 6/2018 | Kobayashi |
| 2020/0161133 A1 | 5/2020 | Nakano |

OTHER PUBLICATIONS

Ahmed Elasser et al., "Silicon Carbide Benefits and Advantages for Power Electronics Circuits and Systems," Proceedings of the IEEE, vol. 90, No. 6, Jun. 2002, pp. 969-986.

J. Hornberger et al., "Silicon carbide (SiC) semiconductor power electronics for extreme high temperature environments," 2004 IEEE Aerospace Conference Proceedings, Dec. 2004, vol. 4, pp. 2538-2555.

Philippe Godignon et al., "SiC Schottky Diodes for Harsh Environment Space Applications," IEEE Transactions on Industrial Electronics, vol. 58, No. 7, Jul. 2011, pp. 2582-2590.

Steve Majerus et al., "Design and Long-Term Operation of High-Temperature, Bulk-CMOS Integrated Circuits for Instrumentation and Control," 2013 IEEE Energytech, Oct. 2013, pp. 1-6.

Kimberly J. Cornett et al., "SiGe BiCMOS Fully Differential Amplifier for Extreme Temperature Range Applications," 2009 IEEE Aerospace conference, Apr. 2009, pp. 1-10.

Jared M. Hornberger et al., "A High-Temperature Multichip Power Module (MCPM) Inverter utilizing Silicon Carbide (SiC) and Silicon on Insulator (SOI) Electronics," 2006 37th IEEE Power Electronics Specialists Conference, Jun. 18-22, 2006, pp. 1-7.

Ranjan R. Lamichhane et al., "A Wide Bandgap Silicon Carbide (SiC) Gate Driver for High-Temperature and High-Voltage Applications," Proceedings of the 26th International Symposium on Power Semiconductor Devices & IC's, Jun. 15-19, 2014, pp. 414-417.

S. Ryu et al., "6H-Sic CMOS Digital IC's Operating on a 5V Power Supply," 1997 55th Annual Device Research Conference Digest, Jun. 23-25, 1997, pp. 38-39.

Jian-Song Chen et al., "High-Temperature Mixed-Signal ICs Using Silicon Carbide CMOS Technology," 1998 Fourth International High Temperature Electronics Conference. HITEC (Cat. No.98EX145), Jun. 14-18, 1998, pp. 292-295.

R.A.R. Young et al., "High Temperature Digital and Analogue Integrated Circuits in Silicon Carbide," Materials Science Forum, Jan. 2013, pp. 1065-1068.

Sei-Hyung Ryu et al., "Digital CMOS IC's in 6H-SiC Operating on a 5-V Power Supply," IEEE Transactions on Electron Devices, vol. 45, No. 1, Jan. 1998, pp. 45-53.

Jian-Song Chen et al., "Design of a Process Variation Tolerant CMOS Opamp in 6H—SiC Technology for High-Temperature Operation," IEEE Transactions on Circuits and Systems—I: Fundamental Theory and Applications, vol. 45, No. 11, Nov. 1998, pp. 1159-1171.

Jian-Song Chen et al., "A Silicon Carbide CMOS Intelligent Gate Driver Circuit with Stable Operation over a Wide Temperature Range," IEEE Journal of Solid-State Circuits, vol. 34, No. 2, Feb. 1999, pp. 192-204.

METHOD OF MANUFACTURING SILICON CARBIDE SEMICONDUCTOR POWER DEVICE

BACKGROUND

Technical Field

The disclosure relates to a power device manufacture, and particularly relates to a method of manufacturing a silicon carbide semiconductor power device.

Description of Related Art

High voltage, field effect transistors, also known as power transistors or silicon carbide semiconductor power transistors, are well known in the semiconductor arts. The silicon carbide semiconductor power devices (vertically constructed junctions) have become very popular for high temperature and high voltage applications.

In general, the silicon carbide semiconductor power devices include the devices for low voltage (LV) circuitry and the devices for high voltage (HV) circuitry, wherein the low supply voltage of silicon carbide CMOS can be applied in the analogy or and digital circuitry with the greatest opportunity for reliable MOS circuits in high temperature environment, while the high voltage MOS power transistors product high drive capability in the high voltage application.

However, the process for manufacturing HV circuit and LV circuit in the same substrate is too complicated to reduce the manufacture cost and time.

SUMMARY

The disclosure provides a method of manufacturing a silicon carbide semiconductor power device to reduce manufacture time and cost while getting better electrical performance and efficiently filtering the noise generated by vertical power trench MOS.

The method of manufacturing the silicon carbide semiconductor power device includes forming a first conductivity type first drift layer on an upper surface of a silicon carbide (SiC) substrate, wherein the SiC substrate includes a low voltage (LV) region and a high voltage (HV) region. Then, a second conductivity type shielding region is formed in the first conductivity type first drift layer, wherein the second conductivity type shielding region comprises a continuous region in the LV region and a plurality of strip regions in the HV region. A first conductivity type second drift layer is formed on the first conductivity type first drift layer, and a second conductivity type first well region and a second conductivity type second well region are formed in the first conductivity type second drift layer simultaneously, wherein the second conductivity type first well region is formed in a first conductivity type MOS region of the LV region, and the second conductivity type second well region is formed in the HV region. A second conductivity type first pick-up region connected to the continuous region and a second conductivity type second pick-up region connected to the strip regions are simultaneously formed in the first conductivity type second drift layer, wherein the first conductivity type MOS region and a second conductivity type MOS region in the LV region are surrounded by the second conductivity type first pick-up region, and the second conductivity type second pick-up region is formed within the HV region. A plurality of grooves is formed in the first conductivity type second drift layer of the HV region, and then a first gate dielectric layer is formed on the first conductivity type second drift layer within the LV region and a second gate dielectric layer is formed on a surface of each of the grooves. A plurality of gates and a plurality of trench gates are simultaneously formed in which the gates are formed on the first gate dielectric layer, and the trench gates are formed in the grooves. The gates are disposed in the first conductivity type MOS region and the second conductivity type MOS region respectively, and the trench gates are formed over the strip regions respectively. A plurality of HV source regions and a plurality of first source/drain regions are simultaneously formed, wherein the HV source regions are formed in the second conductivity type second well region between the trench gates, and the first source/drain regions are formed in the second conductivity type first well region. A second conductivity type first heavily-doped region, a plurality of second conductivity type second heavily-doped regions and a plurality of second source/drain regions are simultaneously formed, wherein the second conductivity type first heavily-doped region is formed in the first conductivity type second drift layer and connected to the second conductivity type second pick-up region, the second conductivity type second heavily-doped regions are formed between the trench gates and connected to the second conductivity type second well region, and the second source/drain regions are formed in the first conductivity type second drift layer within the second conductivity type MOS region.

In one embodiment of the disclosure, a doping concentration of the first conductivity type second drift layer is 1.2 to 3 times of that of the first conductivity type first drift layer.

In one embodiment of the disclosure, each of the strip regions has one end extending outside an area of the second conductivity type second well region.

In one embodiment of the disclosure, the end of each of the strip regions is connected to the second conductivity type first heavily-doped region via the second conductivity type second pick-up region.

In one embodiment of the disclosure, a doping concentration of the first conductivity type first drift layer is ranged from $1E15/cm^3$ to $5E16/cm^3$, and a doping concentration of the second conductivity type shielding region is ranged from $1E17/cm^3$ to $5E18/cm^3$.

In one embodiment of the disclosure, a thickness of the second conductivity type shielding region is ranged from 0.1 μm to 0.4 μm.

In one embodiment of the disclosure, a doping concentration of the second conductivity type first well region and the second conductivity type second well region is ranged from $1E17/cm^3$ to $6E17/cm^3$, and a thickness of the second conductivity type first well region and the second conductivity type second well region is ranged from 1 μm to 2 μm.

In one embodiment of the disclosure, a doping concentration of the second conductivity type first pick-up region and the second conductivity type second pick-up region is ranged from $2E17/cm^3$ to $5E18/cm^3$.

In one embodiment of the disclosure, after the step of forming the second conductivity type first pick-up region and the second conductivity type second pick-up region, further comprising forming a first conductivity type first LDD region in the second conductivity type second well region within the HV region.

In one embodiment of the disclosure, a doping concentration of the first conductivity type first LDD region is ranged from $5E17/cm^3$ to $2E18/cm^3$.

In one embodiment of the disclosure, a thickness of the second gate dielectric layer is ranged from 400 Å to 2000 Å.

In one embodiment of the disclosure, a thickness of the first gate dielectric layer is ranged from 100 Å to 600 Å.

In one embodiment of the disclosure, the second gate dielectric layer is formed before the formation of the first gate dielectric layer.

In one embodiment of the disclosure, the step of forming the plurality of gates and the plurality of trench gates includes depositing a polysilicon layer on the first gate dielectric layer and filling the grooves; forming a patterned mask to cover a portion of the polysilicon layer within the LV region; removing the exposed polysilicon layer by using the patterned mask as an etching mask while etching back the polysilicon layer within the HV region; and removing the patterned mask.

In one embodiment of the disclosure, the step of forming the second conductivity type second heavily-doped region comprises forming a first body region in the second conductivity type first well region.

In one embodiment of the disclosure, the step of forming the plurality of HV source regions comprises forming a second body region in the first conductivity type second drift layer within the second conductivity type MOS region.

In one embodiment of the disclosure, after the step of forming the plurality of gates, further comprising forming a first conductivity type second LDD region in the second conductivity type first well region within the first conductivity type MOS region.

In one embodiment of the disclosure, after the step of forming the plurality of gates, further comprising forming a second conductivity type LDD region in the first conductivity type second drift layer within the second conductivity type MOS region.

In one embodiment of the disclosure, the first conductivity type is n type, and the second conductivity type is p type.

Based on the above, according to the method of the disclosure, the power device in the HV region and CMOS in the LV region can be integrated in the same SiC substrate, so it can significantly reduce manufacture time and cost and improve high temperature reliability performance. Moreover, the pick-up region formed below the trench gates can avoid high electrical field and lower down the effective Cgd value that is positive to AC performance of HV power device operation, and the pick-up region formed in the LV region together with foregoing pickup region can filter the noise generated by the power device in the HV region.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
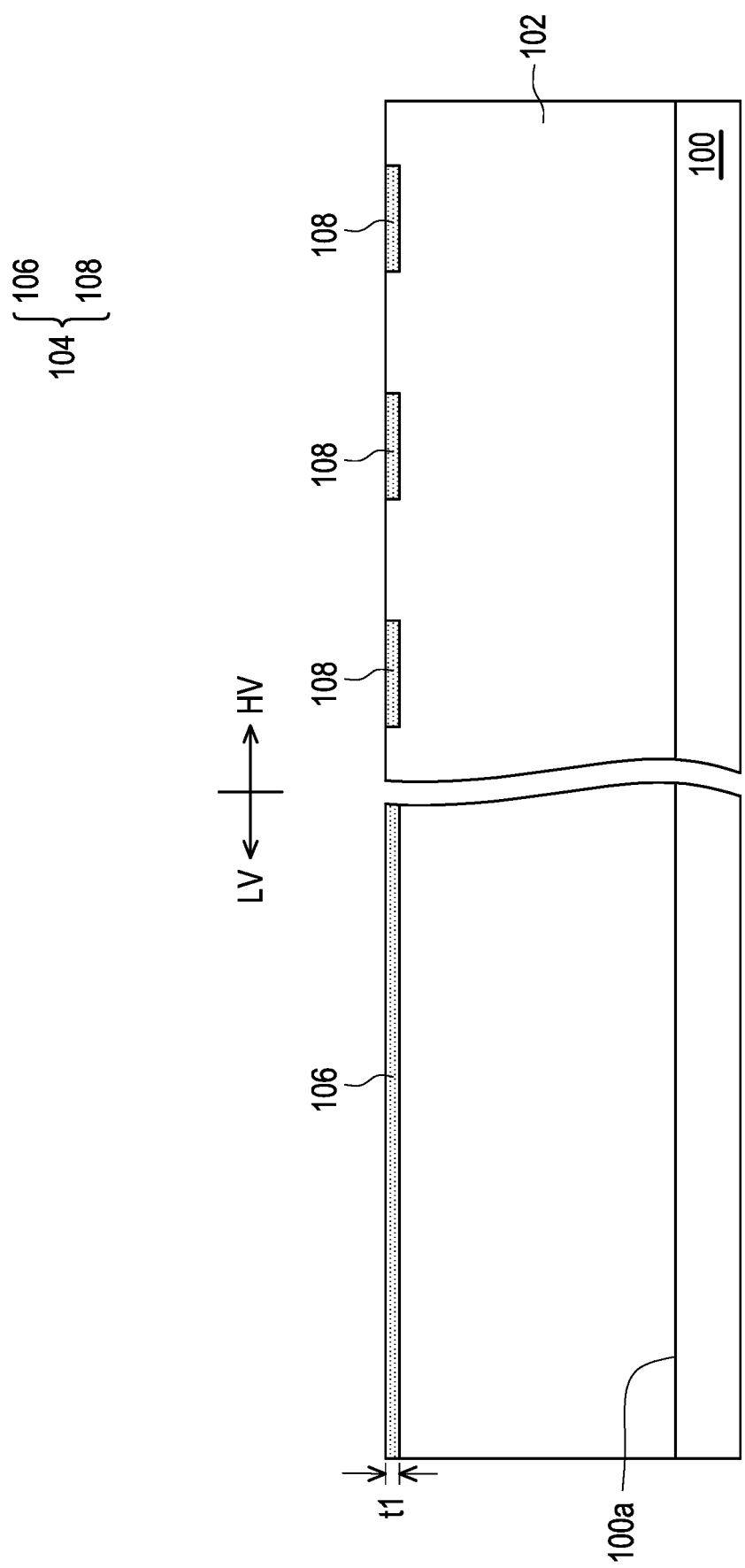
FIGS. 1A to 1I are cross-sectional views illustrating steps of a method of manufacturing a silicon carbide semiconductor power device according to an embodiment of the disclosure.

With reference to the drawings attached, the disclosure will be described by means of the embodiments below. Nevertheless, the disclosure may be embodied in many different forms and should not be construed as limited to the embodiments set forth herein. In the drawings, for the purpose of clarity and specificity, the sizes and the relative sizes of each layer and region may not be illustrated in accurate proportion.

FIGS. 1A to 1I are cross-sectional views illustrating steps of a method of manufacturing a silicon carbide semiconductor power device according to an embodiment of the disclosure.

Referring to FIG. 1A, a silicon carbide (SiC) substrate 100 is utilized, and the SiC substrate 100 may be a first conductivity type substrate, and the first conductivity type is n type, for example. The SiC substrate 100 includes a low voltage region LV and a high voltage region HV. A first conductivity type first drift layer 102 is then formed on an upper surface 100a of the SiC substrate 100. A second conductivity type shielding region 104 is formed in the first conductivity type first drift layer 102. In the embodiment, the second conductivity type is p type. The second conductivity type shielding region 104 includes at least a continuous region 106 in the Low voltage region LV and a plurality of strip regions 108 in the High voltage region HV. In the embodiment, a doping concentration of the first conductivity type first drift layer 102 is ranged from $1E15/cm^3$ to $5E16/cm^3$, and a doping concentration of the second conductivity type shielding region 104 is ranged from $1E17/cm^3$ to $5E18/cm^3$, for instance. The dopants implanted in the second conductivity type shielding region 104 is at least one selected from Al, Boron, and Sn, for instance. However, the disclosure is not limited herein. In one embodiment, a thickness t1 of the second conductivity type shielding region 104 is ranged from 0.1 μm to 0.4 μm, for instance. However, the disclosure is not limited herein.

Figure 1B:
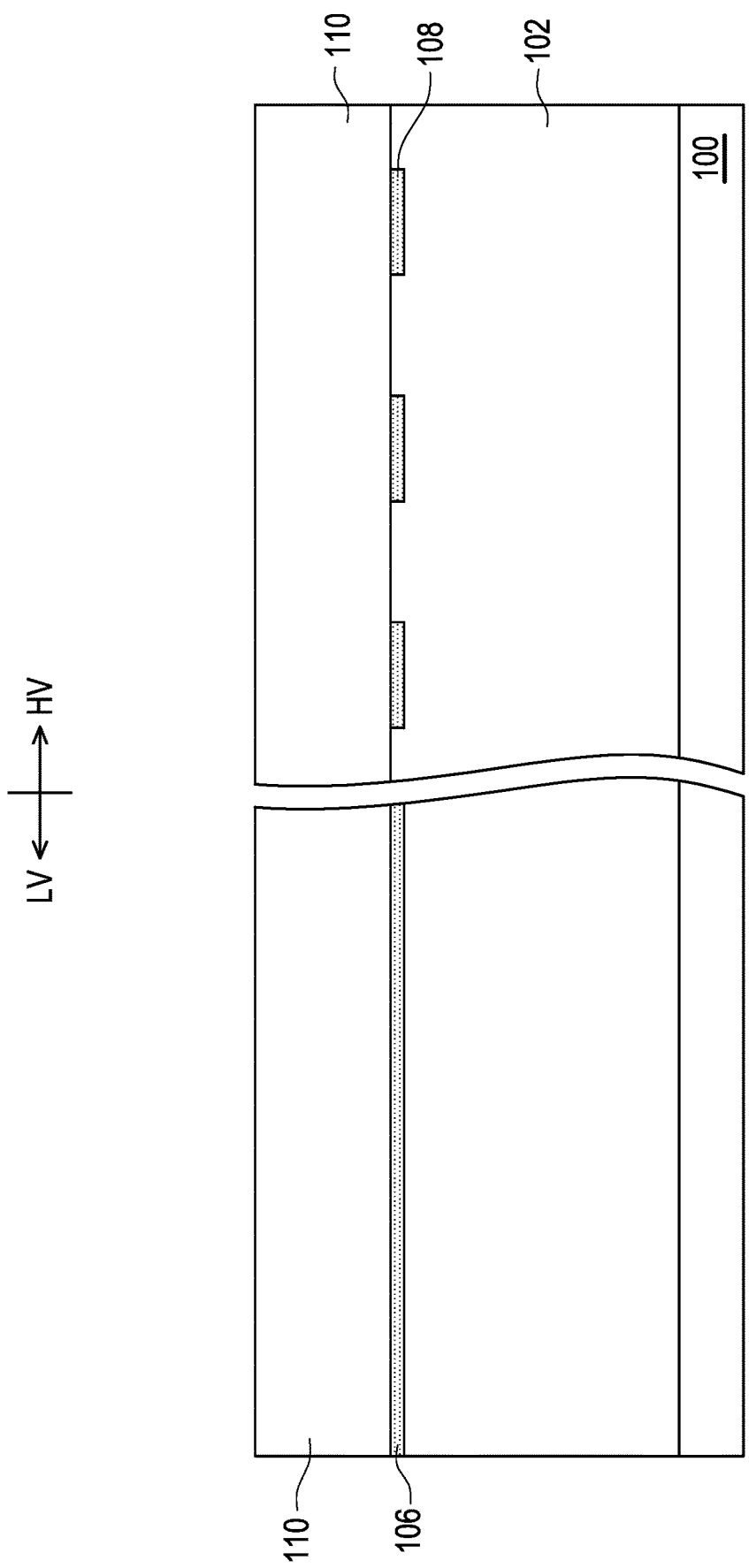

Then, referring to FIG. 1B, a first conductivity type second drift layer 110 is formed on the first conductivity type first drift layer 102. In one embodiment, a doping concentration of the first conductivity type second drift layer 110 is 1.2 to 3 times of that of the first conductivity type first drift layer 102.

Figure 1C:
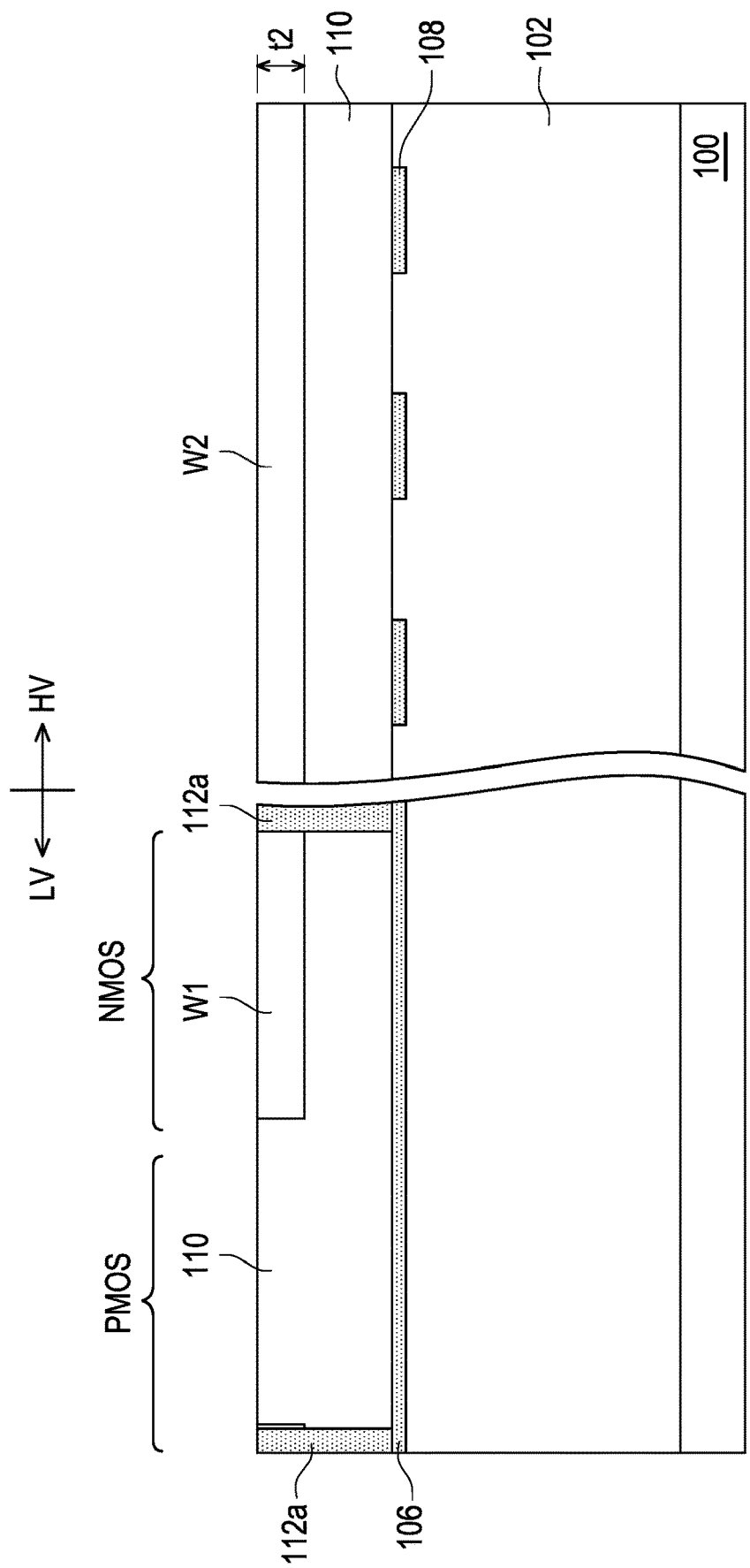

Thereafter, referring to FIG. 1C, a second conductivity type first well region W1 and a second conductivity type second well region W2 are formed in the first conductivity type second drift layer 110 simultaneously, wherein the second conductivity type first well region W1 is formed in a first conductivity type MOS region (e.g. NMOS region) of the Low voltage region LV, and the second conductivity type second well region W2 is formed in the High voltage region HV. In one embodiment, a doping concentration of the second conductivity type first well region W1 and the second conductivity type second well region W2 is ranged from $1E17/cm^3$ to $6E17/cm^3$, and a thickness t2 of the second conductivity type first well region W1 and the second conductivity type second well region W2 is ranged from 1 μm to 2 μm, for instance. However, the disclosure is not limited herein. In one embodiment, a distance between the second conductivity type first well region W1 and the continuous region 106 is ranged from 0.5 μm to 4 μm, for instance. A second conductivity type first pick-up region 112a and a second conductivity type second pick-up region (in FIG. 2) are simultaneously formed in the first conductivity type second drift layer 110, The second conductivity type first pick-up region 112a is connected to the continuous region 106, wherein the first conductivity type MOS region (e.g. NMOS) and a second conductivity type MOS region (e.g. PMOS) in the Low voltage region LV are surrounded by the second conductivity type first pick-up region 112a. The second conductivity type second pick-up region is formed within the High voltage region HV and connected to the strip regions 108 at other cross-section. In one embodiment, a doping concentration of the second conductivity type first pick-up region 112a and the second conductivity type second pick-up region is ranged from $2E17/cm^3$ to $5E18/cm^3$, for instance. However, the disclosure is not limited herein.

Figure 1D:
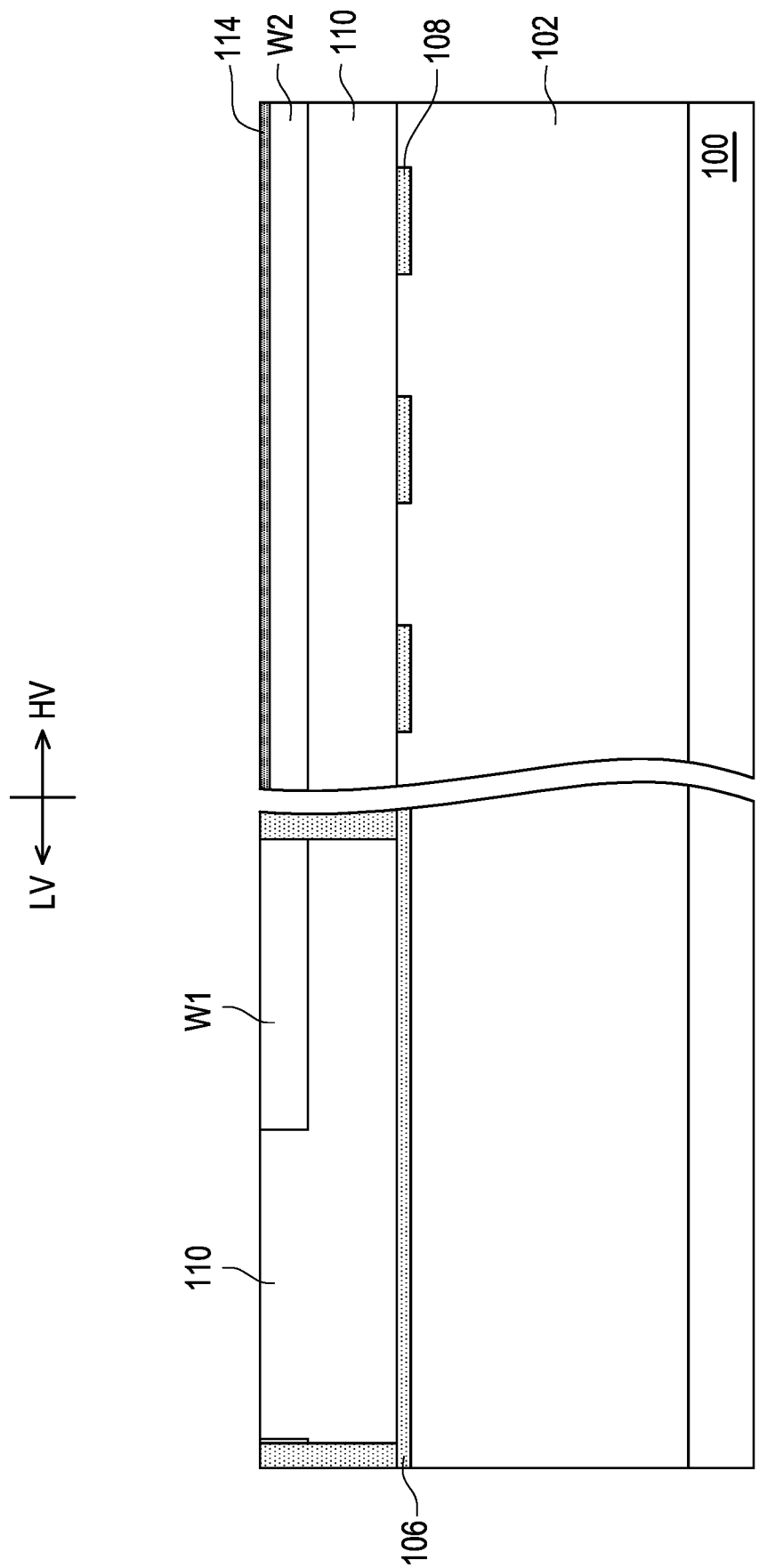

Thereafter, referring to FIG. 1D, if necessary, after the step of forming the second conductivity type first pick-up region 112a and the second conductivity type second pick-up region, a first conductivity type first LDD region 114 can be formed in the second conductivity type second well region W2 within the High voltage region HV. In one embodiment, a doping concentration of the first conductivity type first LDD region 114 is ranged from $5E17/cm^3$ to $5E18/cm^3$, for instance. A depth of the first conductivity type first LDD region 114 is ranged from 0.1 µm to 0.4 µm, for instance. However, the disclosure is not limited herein.

Figure 1E:
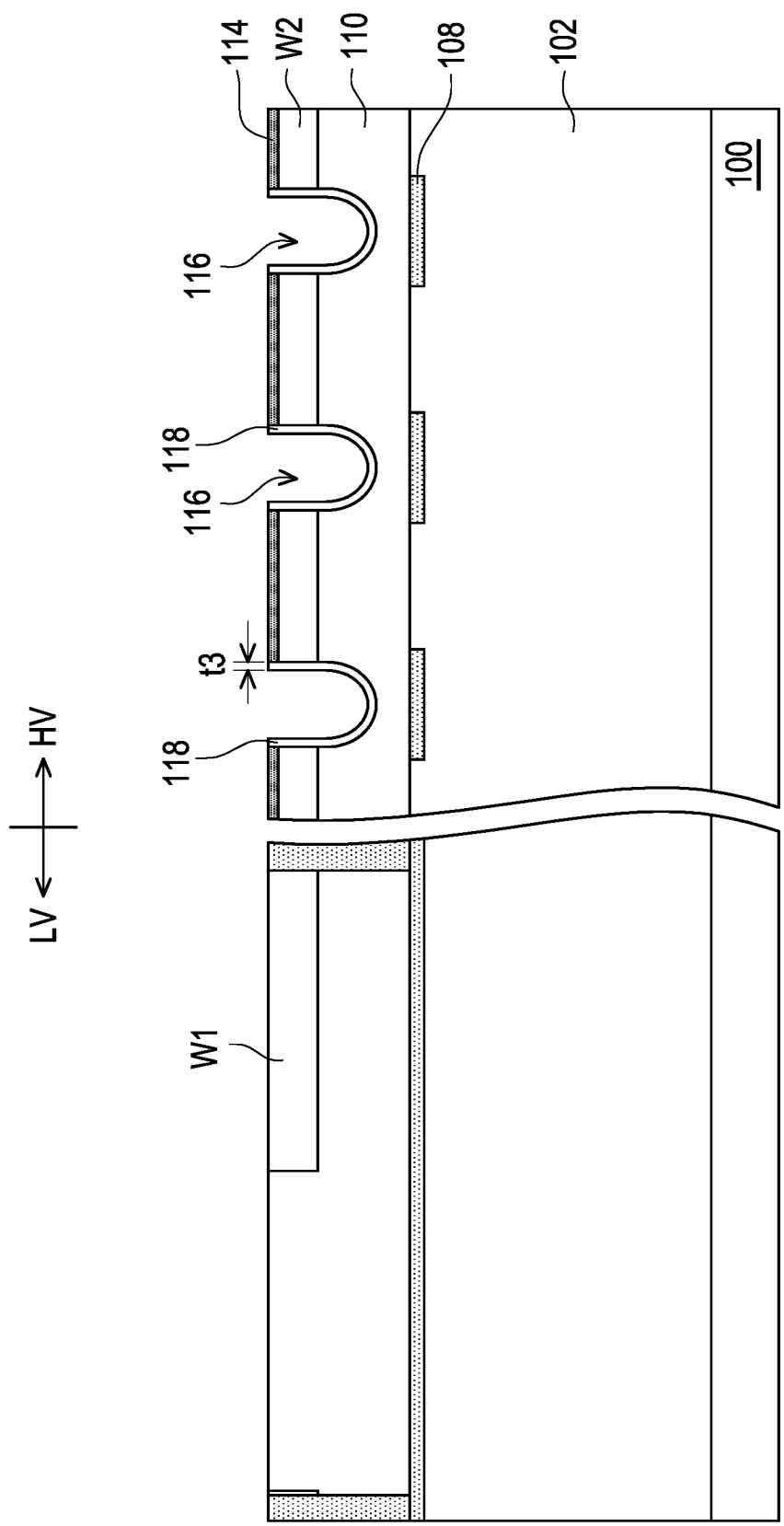

After that, referring to FIG. 1E, a plurality of grooves 116 is formed in the first conductivity type second drift layer 110 of the High voltage region HV, and then a second gate dielectric layer 118 is formed on a surface of each of the grooves 116. Each of the grooves 116 are formed over each of the strip regions 108 in a vertical direction. In one embodiment, a thickness t3 of the second gate dielectric layer 118 is ranged from 400 Å to 2000 Å, for instance. However, the disclosure is not limited herein.

Figure 1F:
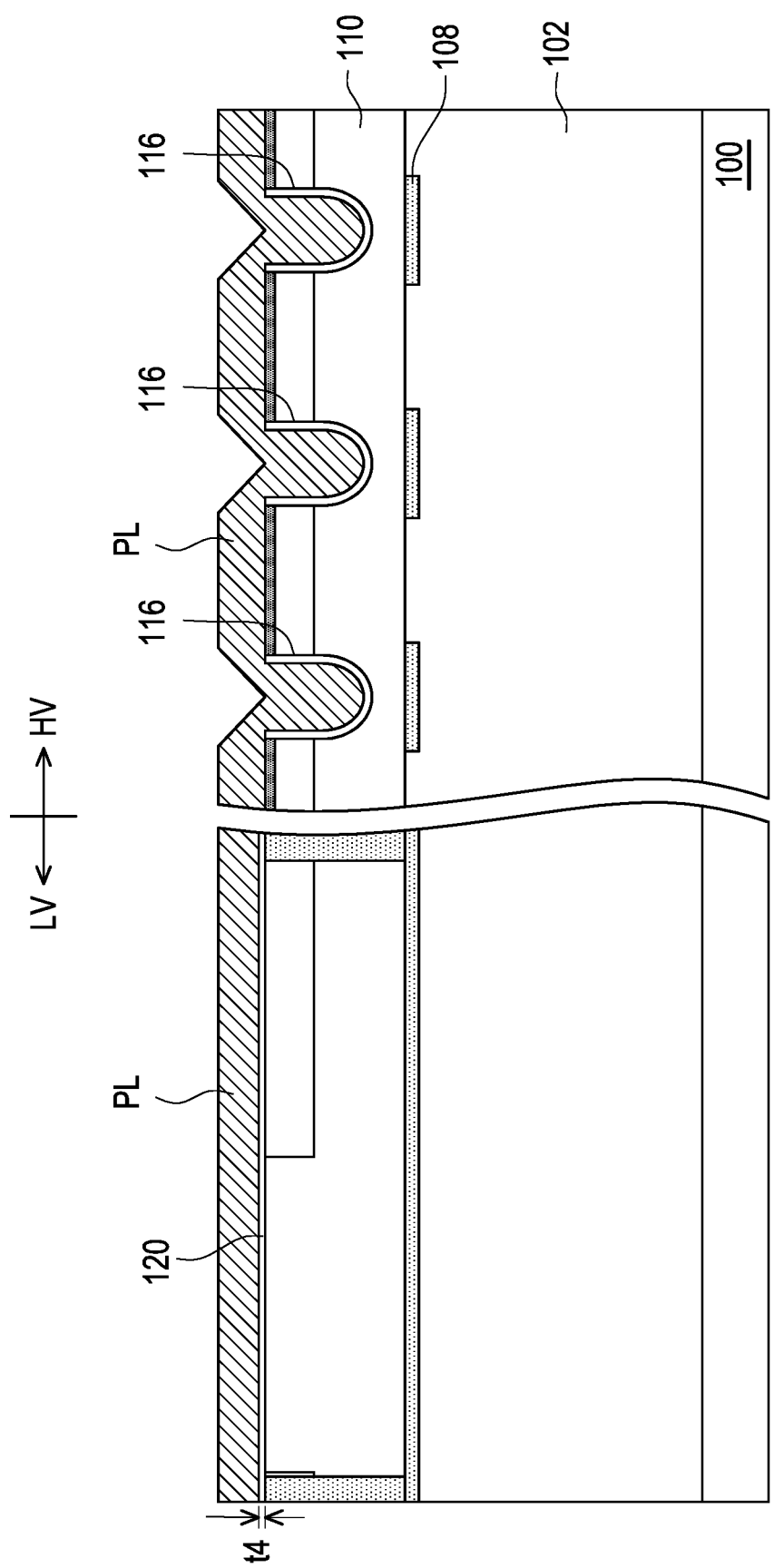

Then, referring to FIG. 1F, a first gate dielectric layer 120 is formed on the first conductivity type second drift layer 110 within the Low voltage region LV. In one embodiment, a thickness t4 of the first gate dielectric layer 120 is ranged from 100 Å to 600 Å, for instance. However, the disclosure is not limited herein. The second gate dielectric layer 118 is formed before the formation of the first gate dielectric layer 120. However, the disclosure is not limited herein; in another embodiment, The first gate dielectric layer 120 can be formed before the formation of the second gate dielectric layer 118. For the formations of the gates in the Low voltage region LV and the trench gates in the High voltage region HV, a polysilicon layer PL is deposited on the first gate dielectric layer 120 and filling the grooves 116.

Figure 1G:
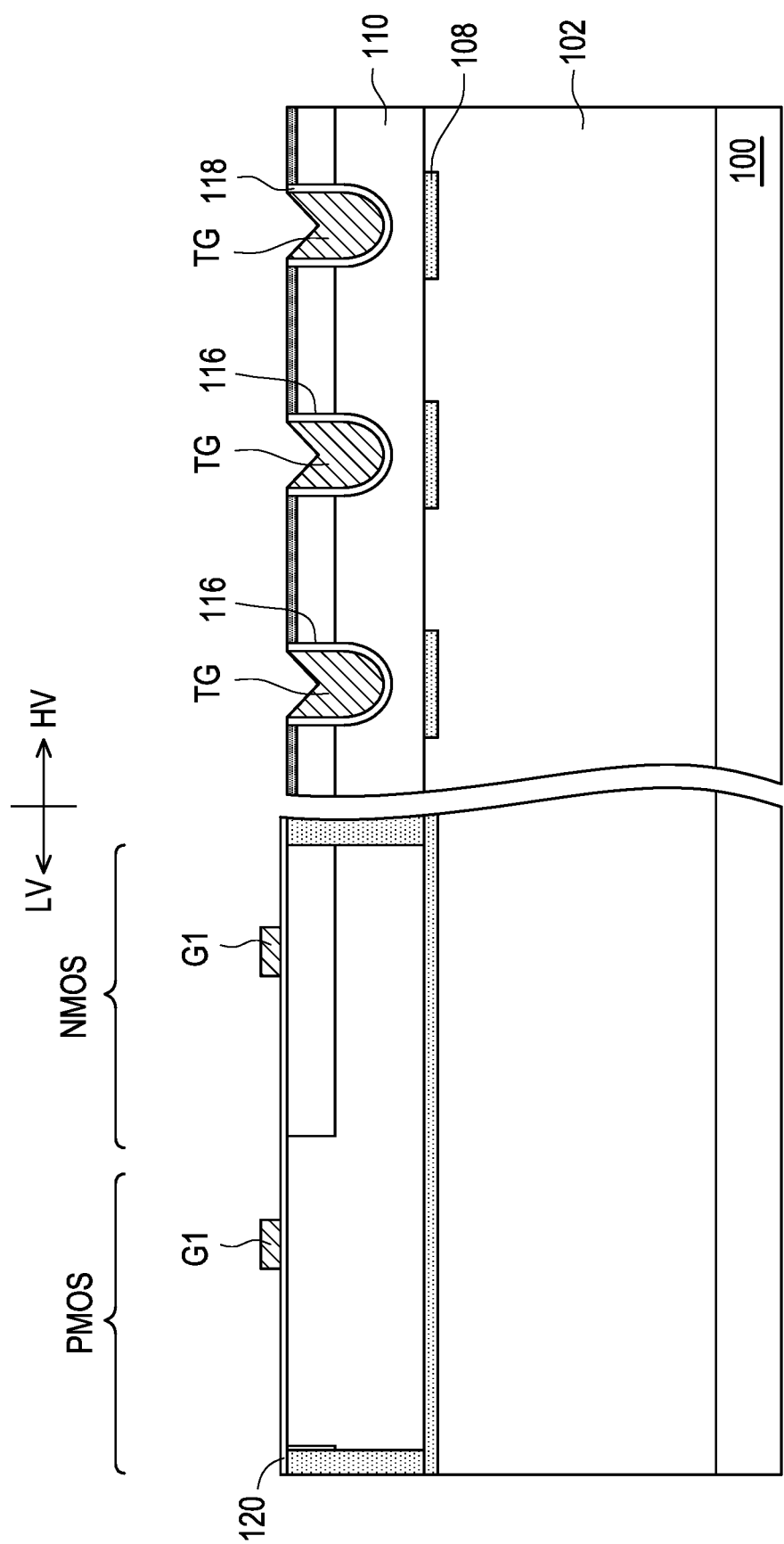

After that, referring to FIG. 1G, a patterned mask (not shown) may be formed to cover a portion of the polysilicon layer PL within the Low voltage region LV, and then the exposed polysilicon layer PL is removed by using the patterned mask as an etching mask, while etching back the polysilicon layer PL within the High voltage region HV. Accordingly, the gates G1 and G2 are respectively formed on the first gate dielectric layer 120 within the first conductivity type MOS region (e.g. NMOS) and the second conductivity type MOS region (e.g. PMOS), and the trench gates TG are respectively formed in the grooves 116 over the strip regions 108. Since each of the strip regions 108 of the second conductivity type shielding region 104 is disposed below the bottom of each of the grooves 116 in which the trench gates TG are formed, the problem of high electrical field of the second gate dielectric layer 118 in the bottom of the grooves 116 can be solved, and the effective Cgd value can be also significant lower down. Therefore, better electrical performance can be accomplished in the operation of power vertical MOSFET in the High voltage region HV, and the oxide reliability in the bottom of the grooves 116 is also improved. Then, the patterned mask may be removed.

Figure 1H:
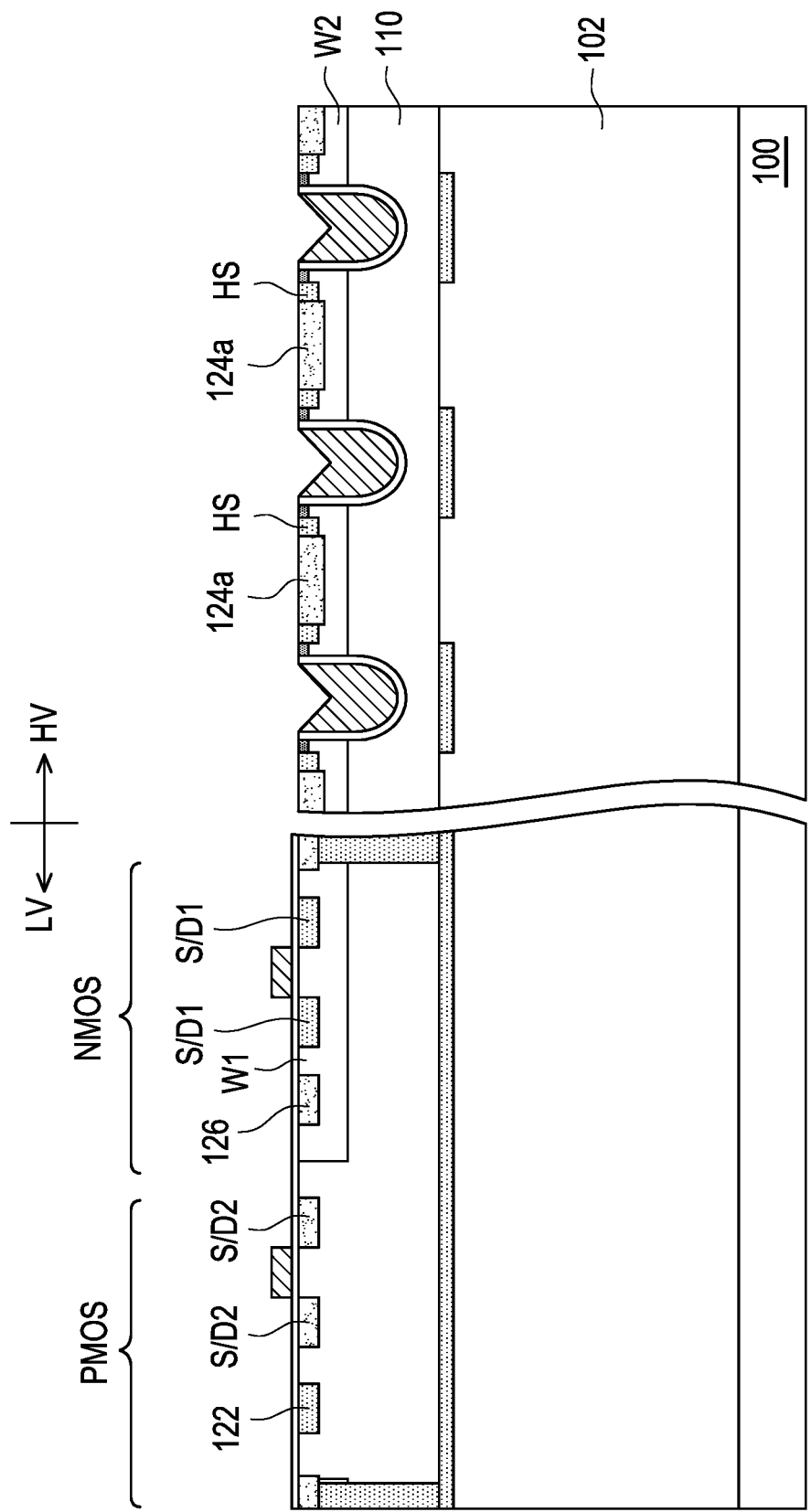
Figure 1I:
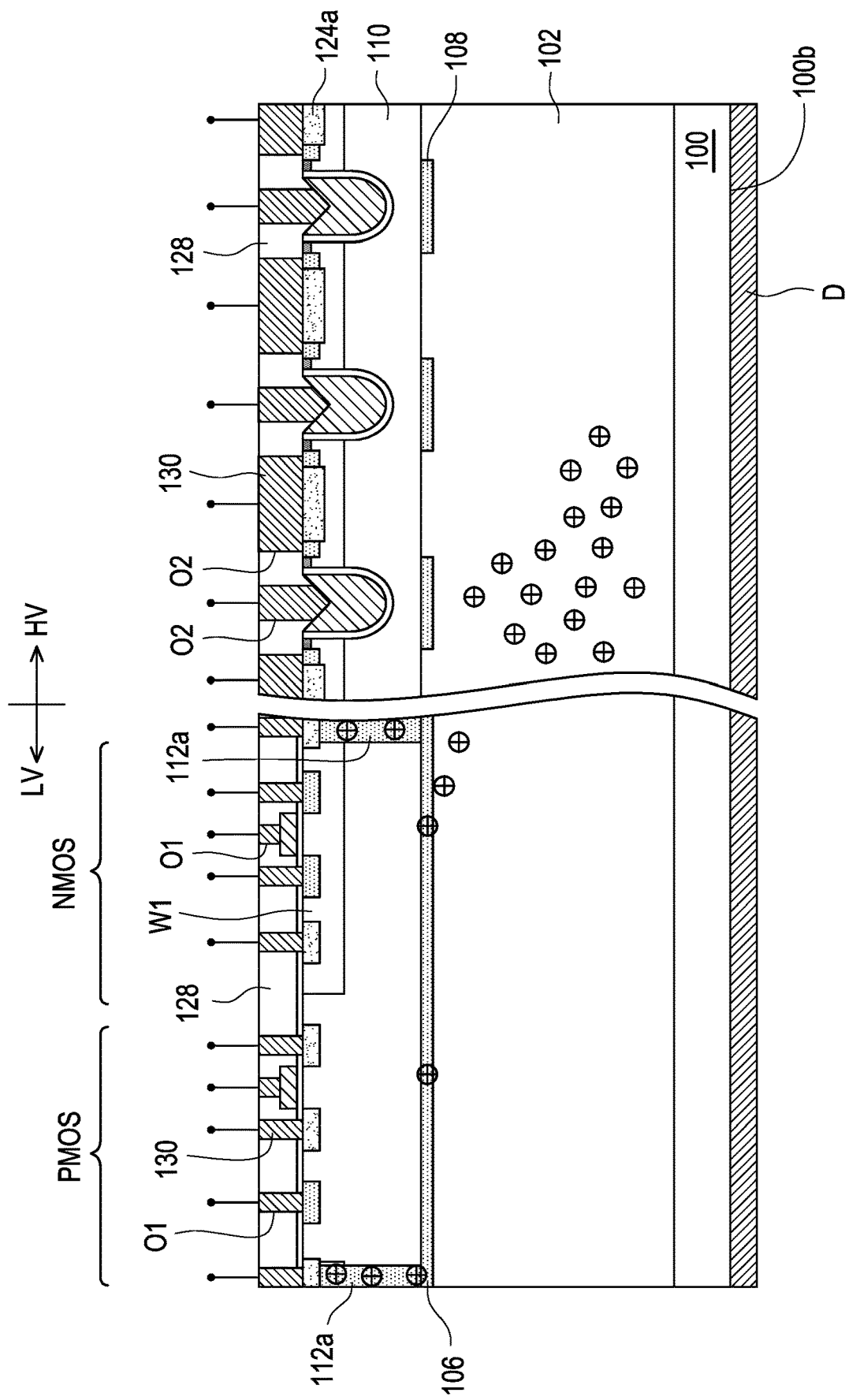

After that, referring to FIG. 1H, a plurality of HV source regions HS and a plurality of first source/drain regions S/D1 are simultaneously formed, wherein the HV source regions HS are formed in the second conductivity type second well region W2 between the trench gates TG, and the first source/drain regions S/D1 are formed in the second conductivity type first well region W1. In one embodiment, the step of forming the plurality of HV source regions HS includes forming a second body region 122 in the first conductivity type second drift layer 110 within the second conductivity type MOS region (e.g. PMOS). A second conductivity type first heavily-doped region (shown in FIG. 2), a plurality of second conductivity type second heavily-doped regions 124a and a plurality of second source/drain regions S/D2 are simultaneously formed, wherein the second conductivity type second heavily-doped regions 124a are formed between the trench gates TG and connected to the second conductivity type second well region W2, and the second source/drain regions S/D2 are formed in the first conductivity type second drift layer 110 within the second conductivity type MOS region. In one embodiment, the step of forming the second conductivity type second heavily-doped region 124a includes forming a first body region 126 in the second conductivity type first well region W1.

Then, referring to FIG. 1, an insulation layer 128 is optionally formed on the first conductivity type second drift layer 110, and then openings O1 and O2 are formed in the insulation layer 128 followed by depositing conductive material (e.g. metal or alloy) 130 in the openings O1 and O2. A HV drain electrode D is formed on a bottom surface 100b of the SiC substrate 100.

According to the silicon carbide semiconductor power device of this embodiment, since the first conductivity type first drift layer 102 and the first conductivity type second drift layer 110 are isolated by the continuous region 106 of the second conductivity type shielding region 104 in the Low voltage region LV, the potential in the first conductivity type first drift layer 102 is different from that in the first conductivity type second drift layer 110. The potential in the first conductivity type second drift layer 110 is bias to source of PMOS, not body bias of PMOS. The second conductivity type first well region W1 was isolated by the first conductivity type second drift layer 110 and the continuous region 106 of the second conductivity type shielding region 104, the noise generated by the power vertical MOSFET in the High voltage region HV can be effectively filtered.

Figure 2:
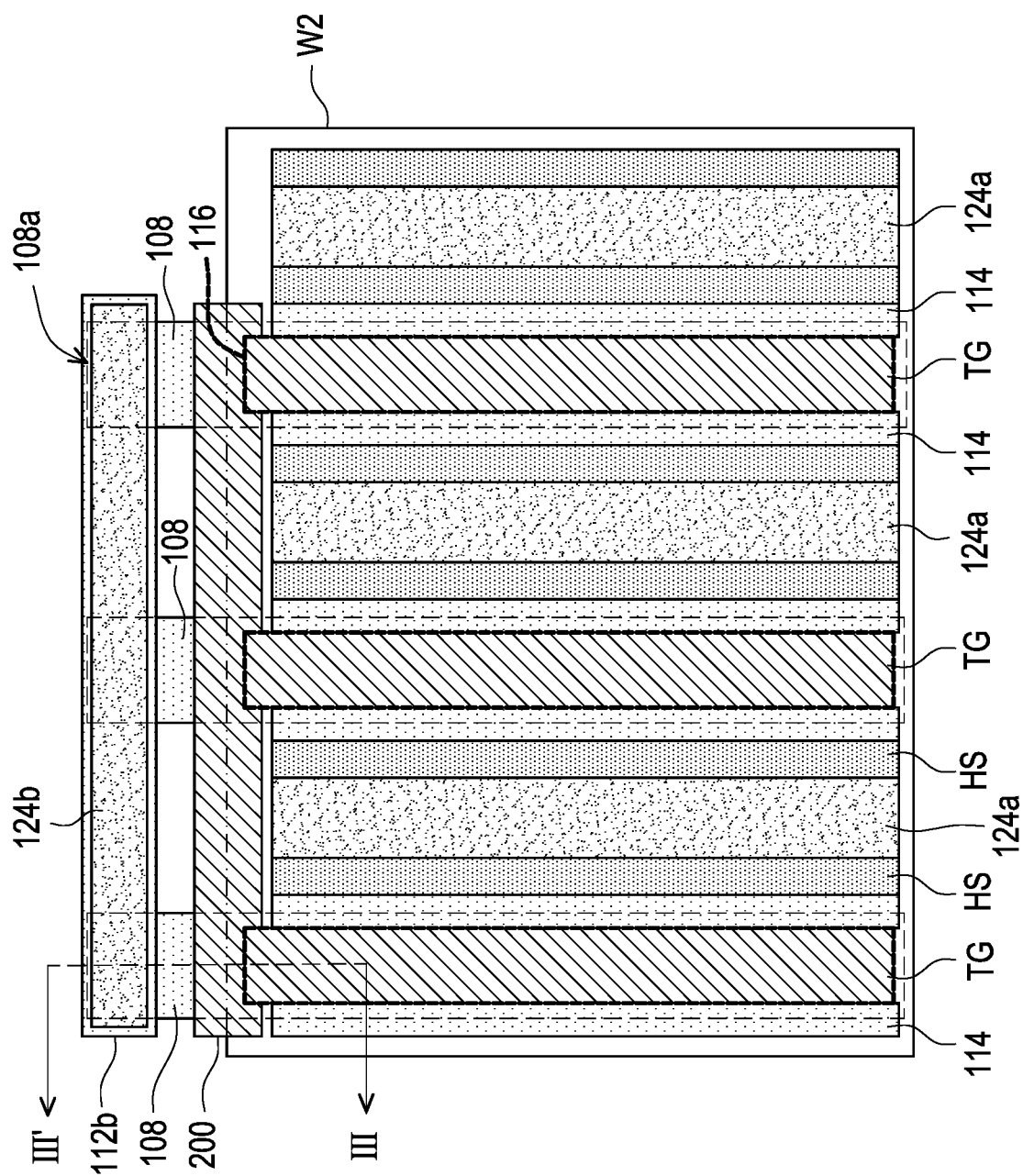
FIG. 2 is a top view illustrating the high voltage (HV) region of the silicon carbide semiconductor power device according to one example of the embodiment.
Figure 3:
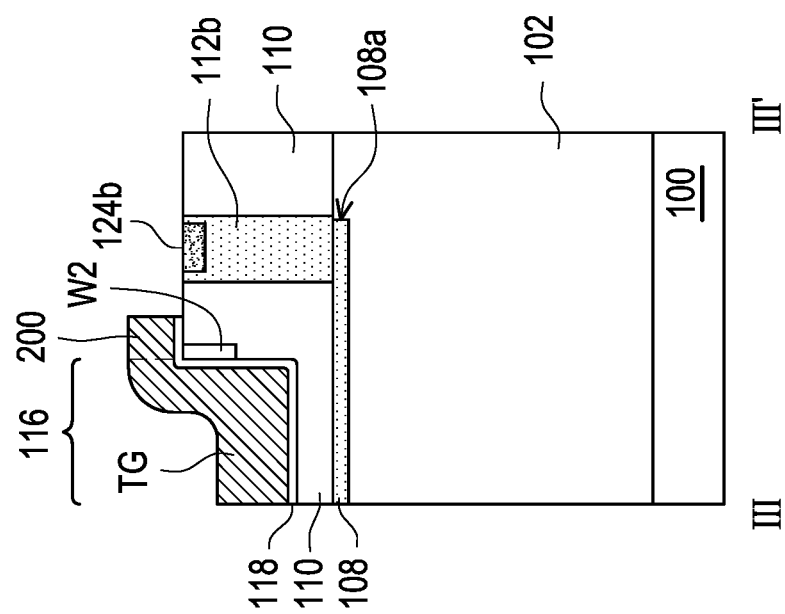
FIG. 3 is cross-sectional view taken along a line III-III' of FIG. 2.

FIG. 2 is a top view illustrating the high voltage (HV) region of the silicon carbide semiconductor power device according to one example of the embodiment, and FIG. 3 is cross-sectional view taken along a line III-III' of FIG. 2. In FIG. 2 and FIG. 3, the same reference numerals as those in FIG. 1 are used to indicate the same or similar components, and the content of the same or similar components is also as provided in the content in FIG. 1 and is not repeated herein. However, the relative positions of these components may be adjusted and differ from those shown in FIG. 1.

Referring to FIGS. 2 and 3, there are three trench gates TG, and a connection portion 200 is formed to connect the trench gates TG. The connection portion 200 may be formed by using the patterned mask recited in the step about FIG. 1G to cover the polysilicon layer outside the grooves 116. However, the disclosure is not limited herein. The number of the trench gates TG and the method of forming the connection portion 200 can be changed as needed. The second conductivity type first heavily-doped region 124b is formed in the first conductivity type second drift layer 110 and connected to the second conductivity type second pick-up region 112b. Each of the strip regions 108 has one end 108a extending outside an area of the second conductivity type second well region W2. In one embodiment, the end 108a of each of the strip regions 108 is connected to the second conductivity type first heavily-doped region 124b via the second conductivity type second pick-up region 112b.

Figure 4:
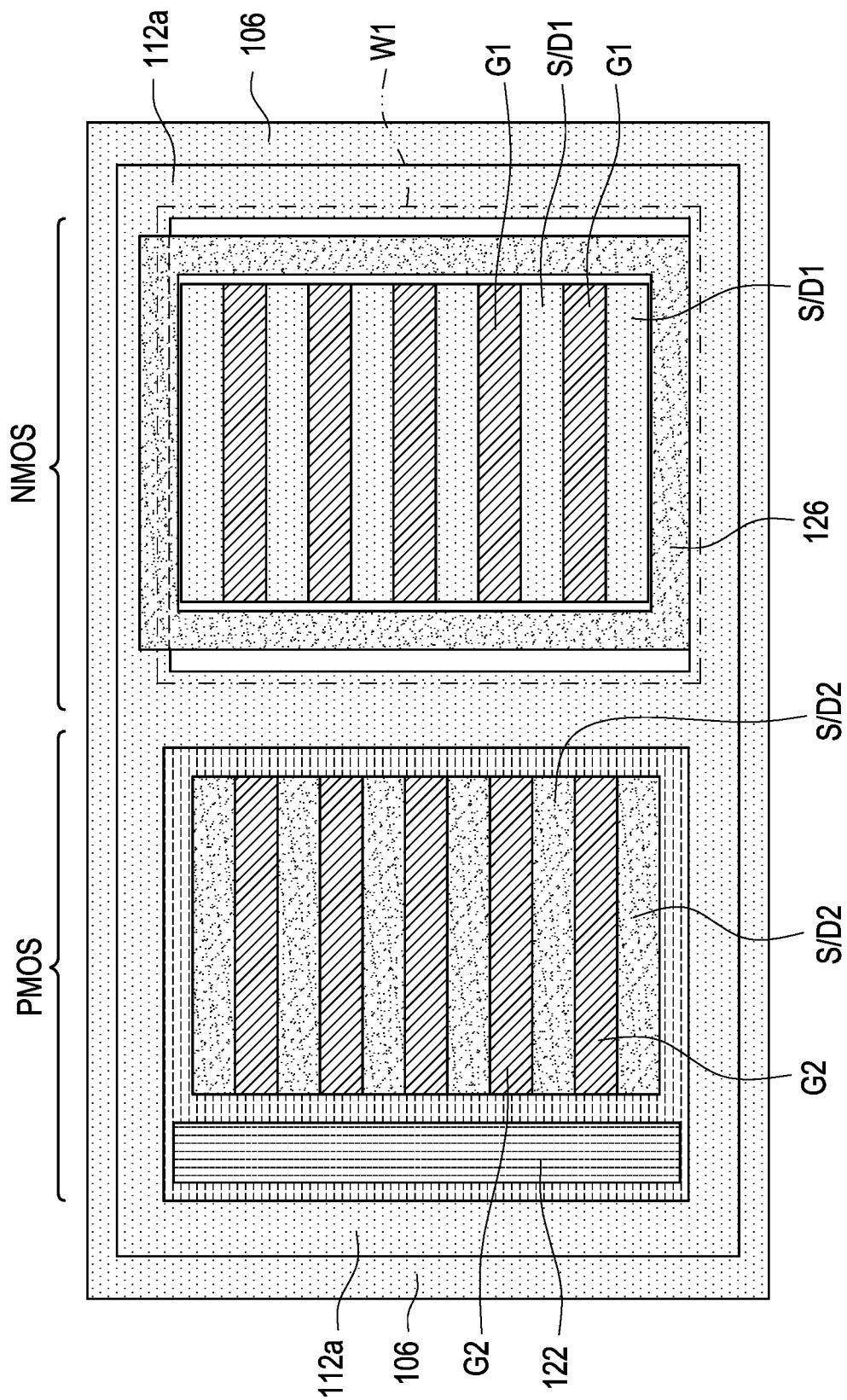
FIG. 4 is a top view illustrating the low voltage (LV) region of the silicon carbide semiconductor power device according to one example of the embodiment.

FIG. 4 is a top view illustrating the low voltage (LV) region of the silicon carbide semiconductor power device according to one example of the embodiment, wherein the same reference numerals as those in FIG. 1 are used to indicate the same or similar components, and the content of the same or similar components is also as provided in the content in FIG. 1 and is not repeated herein. However, the relative positions of these components may be adjusted and differ from those shown in FIG. 1.

Referring to FIG. 4, a PMOS region and a NMOS region constitute CMOS. In the PMOS region, the second source/drain regions S/D2 are formed at two sides of each of the gate G2, and in one embodiment, after the step of forming the gates G2 (after the step of FIG. 1G), a second conductivity type LDD region (not shown) may be formed in the first conductivity type second drift layer between the gate G2 and the second source/drain region S/D2. In the NMOS region, the first source/drain regions S/D1 are formed at two sides of each of the gate G1, and in one embodiment, after the step of forming the gates G1 (after the step of FIG. 1G), a first conductivity type second LDD region (not shown) may be formed between the gate G1 and the first source/drain regions S/D1 in the second conductivity type first well region W1. Even through the arrangement direction of the gates G1 and G2 is different from that of the gates G1 and G2 in FIG. 1, the process of FIG. 1 can still manufacture the CMOS in the silicon carbide semiconductor power device structure of FIG. 4 by adjusting the photomask pattern. In addition, the second body region 122 is disposed at one side of the PMOS region, and the gates G1 and the first source/drain regions S/D1 are surrounded by the first body region 126.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A method of manufacturing a silicon carbide semiconductor power device, comprising:
    forming a first conductivity type first drift layer on an upper surface of a silicon carbide (SiC) substrate, wherein the SiC substrate includes a low voltage (LV) region and a high voltage (HV) region;
    forming a second conductivity type shielding region in the first conductivity type first drift layer, wherein the second conductivity type shielding region comprises a continuous region in the LV region and a plurality of strip regions in the HV region;
    forming a first conductivity type second drift layer on the first conductivity type first drift layer;
    forming a second conductivity type first well region and a second conductivity type second well region in the first conductivity type second drift layer simultaneously, wherein the second conductivity type first well region is formed in a first conductivity type MOS region of the LV region, and the second conductivity type second well region is formed in the HV region;
    forming a second conductivity type first pick-up region connected to the continuous region and a second conductivity type second pick-up region connected to the strip regions in the first conductivity type second drift layer simultaneously, wherein the first conductivity type MOS region and a second conductivity type MOS region in the LV region are surrounded by the second conductivity type first pick-up region, and the second conductivity type second pick-up region is formed within the HV region;
    forming a plurality of grooves in the first conductivity type second drift layer of the HV region;
    forming a first gate dielectric layer on the first conductivity type second drift layer within the LV region and a second gate dielectric layer on a surface of each of the grooves;
    forming a plurality of gates on the first gate dielectric layer and a plurality of trench gates in the plurality of grooves simultaneously, wherein the gates are disposed in the first conductivity type MOS region and the second conductivity type MOS region respectively, and the trench gates are formed over the strip regions respectively;
    forming a plurality of HV source regions in the second conductivity type second well region between the trench gates and a plurality of first source/drain regions in the second conductivity type first well region simultaneously; and
    forming a second conductivity type first heavily-doped region, a plurality of second conductivity type second heavily-doped regions and a plurality of second source/drain regions simultaneously, wherein the second conductivity type first heavily-doped region is formed in the first conductivity type second drift layer and connected to the second conductivity type second pick-up region, the second conductivity type second heavily-doped regions are formed between the trench gates and connected to the second conductivity type second well region, and the second source/drain regions are formed in the first conductivity type second drift layer within the second conductivity type MOS region.

2. The method of manufacturing a silicon carbide semiconductor power device of claim 1, wherein a doping concentration of the first conductivity type second drift layer is 1.2 to 3 times of that of the first conductivity type first drift layer.

3. The method of manufacturing a silicon carbide semiconductor power device of claim 1, wherein each of the strip regions has one end extending outside an area of the second conductivity type second well region.

4. The method of manufacturing a silicon carbide semiconductor power device of claim 3, wherein the end of each of the strip regions is connected to the second conductivity type first heavily-doped region via the second conductivity type second pick-up region.

5. The method of manufacturing a silicon carbide semiconductor power device of claim 1, wherein a doping concentration of the first conductivity type first drift layer is ranged from $1E15/cm^3$ to $5E16/cm^3$, and a doping concentration of the second conductivity type shielding region is ranged from $1E17/cm^3$ to $5E18/cm^3$.

6. The method of manufacturing a silicon carbide semiconductor power device of claim 1, wherein a thickness of the second conductivity type shielding region is ranged from 0.1 µm to 0.4 µm.

7. The method of manufacturing a silicon carbide semiconductor power device of claim 1, wherein a doping concentration of the second conductivity type first well region and the second conductivity type second well region is ranged from $1E17/cm^3$ to $6E17/cm^3$, and a thickness of the second conductivity type first well region and the second conductivity type second well region is ranged from 1 µm to 2 µm.

8. The method of manufacturing a silicon carbide semiconductor power device of claim 1, wherein a doping concentration of the second conductivity type first pick-up region and the second conductivity type second pick-up region is ranged from $2E17/cm^3$ to $5E18/cm^3$.

9. The method of manufacturing a silicon carbide semiconductor power device of claim 1, wherein after the step of forming the second conductivity type first pick-up region and the second conductivity type second pick-up region, further comprising forming a first conductivity type first LDD region in the second conductivity type second well region within the HV region.

10. The method of manufacturing a silicon carbide semiconductor power device of claim 9, wherein a doping concentration of the first conductivity type first LDD region is ranged from $5E17/cm^3$ to $5E18/cm^3$.

11. The method of manufacturing a silicon carbide semiconductor power device of claim 1, wherein a thickness of the second gate dielectric layer is ranged from 400 Å to 2000 Å.

12. The method of manufacturing a silicon carbide semiconductor power device of claim 1, wherein a thickness of the first gate dielectric layer is ranged from 100 Å to 600 Å.

13. The method of manufacturing a silicon carbide semiconductor power device of claim 1, wherein the second gate dielectric layer is formed before the formation of the first gate dielectric layer.

14. The method of manufacturing a silicon carbide semiconductor power device of claim 1, wherein the step of forming the plurality of gates and the plurality of trench gates comprises:
depositing a polysilicon layer on the first gate dielectric layer and filling the grooves;
forming a patterned mask to cover a portion of the polysilicon layer within the LV region;
removing the exposed polysilicon layer by using the patterned mask as an etching mask while etching back the polysilicon layer within the HV region; and
removing the patterned mask.

15. The method of manufacturing a silicon carbide semiconductor power device of claim 1, wherein the step of forming the second conductivity type second heavily-doped region comprises forming a first body region in the second conductivity type first well region.

16. The method of manufacturing a silicon carbide semiconductor power device of claim 1, wherein the step of forming the plurality of HV source regions comprises forming a second body region in the first conductivity type second drift layer within the second conductivity type MOS region.

17. The method of manufacturing a silicon carbide semiconductor power device of claim 1, wherein after the step of forming the plurality of gates, further comprising forming a first conductivity type second LDD region in the second conductivity type first well region within the first conductivity type MOS region.

18. The method of manufacturing a silicon carbide semiconductor power device of claim 1, wherein after the step of forming the plurality of gates, further comprising forming a second conductivity type LDD region in the first conductivity type second drift layer within the second conductivity type MOS region.

19. The method of manufacturing a silicon carbide semiconductor power device of claim 1, wherein the first conductivity type is n type, and the second conductivity type is p type.

* * * * *